(12) United States Patent
Fujii et al.

(10) Patent No.: US 9,245,830 B2
(45) Date of Patent: Jan. 26, 2016

(54) LEAD BUILT-IN TYPE CIRCUIT PACKAGE AND METHOD FOR PRODUCING SAME

(71) Applicant: NEW JAPAN RADIO CO., LTD, Tokyo (JP)

(72) Inventors: Yoshio Fujii, Tokyo (JP); Eisuke Mori, Tokyo (JP); Hideki Muto, Tokyo (JP); Shinji Hara, Saitama (JP)

(73) Assignee: NEW JAPAN RADIO CO., LTD. (JP)

( * ) Notice: Subject to any disclaimer, the term of this patent is extended or adjusted under 35 U.S.C. 154(b) by 0 days.

(21) Appl. No.: 14/574,547

(22) Filed: Dec. 18, 2014

(65) Prior Publication Data

US 2015/0262921 A1 Sep. 17, 2015

(30) Foreign Application Priority Data

Mar. 15, 2014 (JP) .................................. 2014-52835

(51) Int. Cl.
*H01L 23/495* (2006.01)
*H01L 21/48* (2006.01)
*H01L 23/31* (2006.01)
*H01L 21/56* (2006.01)
*H01L 23/00* (2006.01)

(52) U.S. Cl.
CPC ...... *H01L 23/49541* (2013.01); *H01L 21/4821* (2013.01); *H01L 21/4842* (2013.01); *H01L 21/561* (2013.01); *H01L 21/565* (2013.01); *H01L 23/3107* (2013.01); *H01L 24/96* (2013.01); *H01L 23/49582* (2013.01); *H01L 2924/12042* (2013.01); *H01L 2924/181* (2013.01)

(58) Field of Classification Search
CPC ..... H01L 33/62; H01L 51/5012; H01L 51/56; H01L 51/0072; H01L 51/5056
USPC ............ 257/666, E21.506, E23.031; 438/123
See application file for complete search history.

(56) References Cited

U.S. PATENT DOCUMENTS

| 5,317,189 | A  | * | 5/1994 | Tsuji et al. ..................... 257/694 |
| 6,268,646 | B1 | * | 7/2001 | Sugimoto et al. ............. 257/673 |
| 6,900,524 | B1 | * | 5/2005 | Minamio et al. ............. 257/669 |
| 7,538,416 | B2 | * | 5/2009 | Minamio et al. ............. 257/676 |
| 8,502,362 | B2 | * | 8/2013 | Williams ....................... 257/676 |
| 2004/0150078 | A1 | * | 8/2004 | Minamio et al. ............. 257/669 |

FOREIGN PATENT DOCUMENTS

| JP | 0621293 | 1/1994 |
| JP | 0686349 | 3/1994 |

* cited by examiner

*Primary Examiner* — Andy Huynh
(74) *Attorney, Agent, or Firm* — Perman & Green, LLP

(57) ABSTRACT

A circuit package having an inner lead, an outer lead and a circuit element is provided, in which the circuit element is connected a first surface of the inner lead. The circuit package has a first molded resin portion and second molded resin portions. The first molded resin portion is formed from a second surface, opposite to the first surface, of the inner lead toward the first surface inner lead embedding the inner lead and the circuit element. And the second molded resin portions are formed on side portions of the outer lead excluding the first and second surfaces of the outer lead.

2 Claims, 6 Drawing Sheets

LEAD BUILT-IN TYPE CIRCUIT PACKAGE AND METHOD FOR PRODUCING SAME

TECHNICAL FIELD

The present invention relates to a lead built-in type circuit package using a lead frame which is applied to electronic parts such as diode devices and resistors and to a production method thereof.

BACKGROUND OF THE INVENTION

In the case of mounting electronic parts such as diodes and resistors on an electric circuit, for example, packages having a lead such as an axial lead type package and packages having no lead such as a chip resistor have been mostly used.

Recently a circuit packaging technology has been improved and high density packaged products are increasing. Also in mounting by welding, a strong demand for downsizing is largely increasing, and, for example, use of a small size package having a lead is demanded so as not to damage a semiconductor element due to a thermal stress at welding.

Further, a scope of use of electronic parts such as diodes and resistors has been enlarged and accordingly, various sizes of circuit packages have been required.

Meanwhile, as described in JP 6-086349 A and JP 6-021293 A, axial lead type circuit packages have been used mostly as a circuit package for the above-mentioned diodes and resistors. However, in the case of producing packages of this type, since a metal mold for forming a molded resin for protecting a diode and a resistor and a cutting die for cutting a lead are required essentially depending on specifications, a large investment was necessary for production.

Also, it is demanded to flexibly comply with requirements for a package size according to specifications of electronic parts such as a diode and a resistor. However, in order to comply with such a demand, a mold for forming a molded resin and a cutting die being suitable for each specification are necessary. Therefore, there is a problem that higher equipment investment is necessary and more production cost is required.

Furthermore, in the case of semiconductor elements, outer leads for mounting on an electric circuit are used and a length of outer leads is rather long in consideration of cutting by a cutting die. Therefore, there was a problem that an excess portion arises when connecting to individual electric circuits.

SUMMARY OF THE INVENTION

The present invention was made in light of the above-mentioned problems, and an object of the present invention is to provide a lead built-in type circuit package which can reduce equipment investment and production cost and allows a package size to be easily changed according to specifications and in which an outer lead having a proper length can be produced, and a production method thereof.

In order to achieve the above-mentioned object, in a circuit package in which either of a right surface or a back surface of a lead frame having an inner lead and an outer lead serves as a top surface and a circuit element is connected on the top surface of the inner lead of the lead frame, the lead built-in type circuit package of the present invention has a first molded resin portion formed at an upper side of a bottom surface of the lead frame so as to cover the inner lead of the lead frame and a portion of the circuit element to be connected to the inner lead and a second molded resin portion formed at side portions of the outer lead except the top and bottom surfaces of the outer lead.

Here, the inner lead refers to a lead portion covered by the resin (of the first molded resin portion) covering the top surface of the lead frame, and a lead portion extending outside the first molded resin portion is referred to as the outer lead.

The method for producing the lead built-in type circuit packages of the present invention is characterized by comprising: providing aggregated lead frames for forming a plurality of lead built-in type circuit packages, having inner leads, outer leads and tie bars formed at a given position on the outer lead; connecting a plurality of circuit elements for a plurality of circuit packages, respectively to a top surface which is either of a right surface or a back surface of the aggregated lead frames, thus forming an aggregate including the aggregated lead frames and the circuit elements; putting a mold having a flange portion facing the outer lead on the top surface of the lead frame, thus forming a cavity on the top surface side of the inner lead of the aggregate; injecting a molding resin so as to cover the circuit element portion with the first molded resin portion and form the second molded resin portion at side portions of the outer lead; and separating the aggregate having the first molded resin portion and the second molded resin portion into respective packages by dicing for singulation.

According to the above-mentioned configurations of the method, the lead built-in type circuit packages are produced by forming the resin on the side portions of the lead frame and the circumference and connecting portions of the circuit element and the lead frame by the resin molding of one surface (metallic molding) and cutting the lead to a proper length by dicing according to specification. Therefore, only a mold for one side (top portion) is used for the resin molding and a cutting die is not required.

According to the configurations of the present invention, there are effects such that molding of the resin can be performed only with a mold for one surface, and a length of a lead can be changed optionally by dicing, which assures that there is no need of providing upper and lower molds and a cutting die for each package, and further a package size can be changed optionally according to specification, which makes it possible to greatly reduce initial investment and production cost.

Further, since it is possible to set the length of the lead of the lead frame to be longer at the time of production and cut the lead to a proper length for applications at the time of dicing, unnecessary lead is not generated when mounting the lead frame on an electric circuit, and no waste is generated.

Furthermore, since the both sides of the lead are fixed with the molded resin, there is an advantage that welding on the top and bottom surfaces of the lead can be performed easily.

DETAILED DESCRIPTION

Figure 1A:
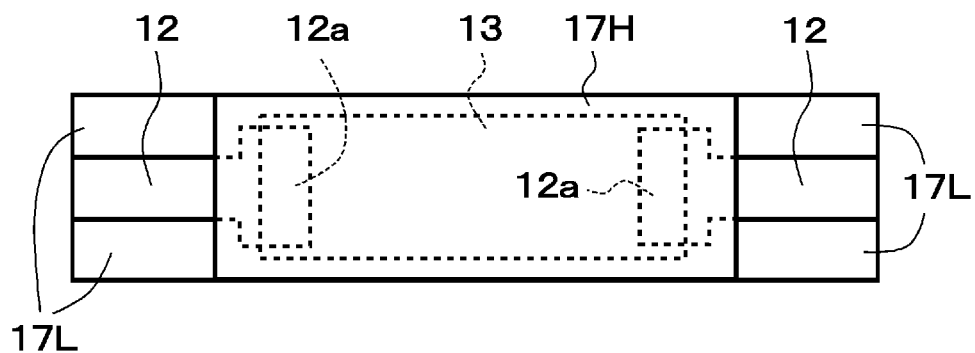
FIG. 1A is a top view illustrating a configuration of a lead built-in type circuit package of one embodiment of the present invention.
Figure 1B:
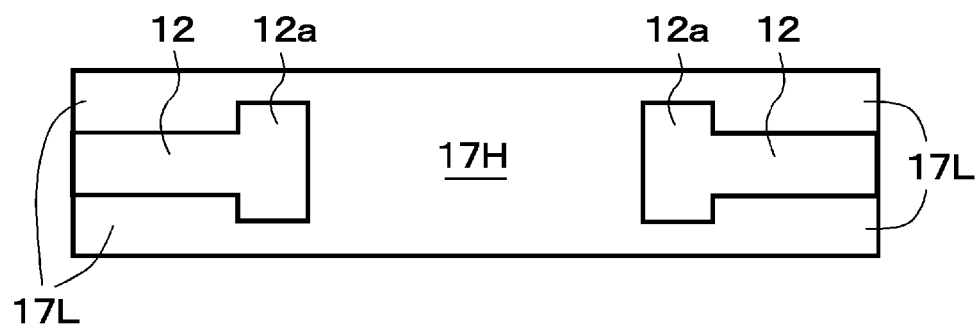
FIG. 1B is a bottom view illustrating a configuration of a lead built-in type circuit package of one embodiment of the present invention.
Figure 1C:
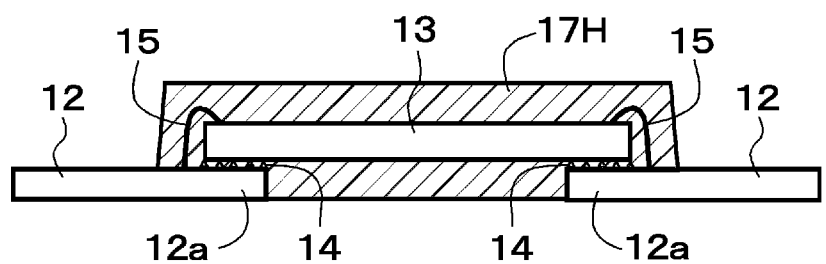
FIG. 1C is a side cross-sectional view illustrating a configuration of a lead built-in type circuit package of one embodiment of the present invention.

As shown in FIG. 1A to FIG. 1C, in the lead built-in type circuit package of the present invention in which either of a right surface or a back surface of a lead frame 10 having an inner lead 12a and an outer lead 12 serves as a top surface and a circuit element 13 is connected on the top surface of the inner lead 12a of the lead frame 10, a first molded resin portion 17H is formed at an upper side of a bottom surface of the lead frame 10 so as to cover the inner lead 12a of the lead frame 10 and a portion of the circuit element 13 to be connected to the inner lead 12a and a second molded resin portion 17L is formed at side portions of the outer lead 12 except the top and bottom surfaces of the outer lead 12.

As shown in FIG. 1A and FIG. 1C, a pair of right and left outer leads 12 is used per one circuit element, and as shown in FIG. 1C, the circuit element (semiconductor element) 13 is connected to the end portions of the inner lead 12a. Namely, in this embodiment, the bottom surfaces at both end portions of the circuit element 13 are connected to the end portions of the inner leads 12a with a nonconductive die attach material 14 such as a resin paste or a resin film, and terminals on the top surface of the circuit element 13 are connected to the inner leads 12a by means of a wire 15 made of a metal such as gold, copper or aluminum (wire bonding).

Figure 3:
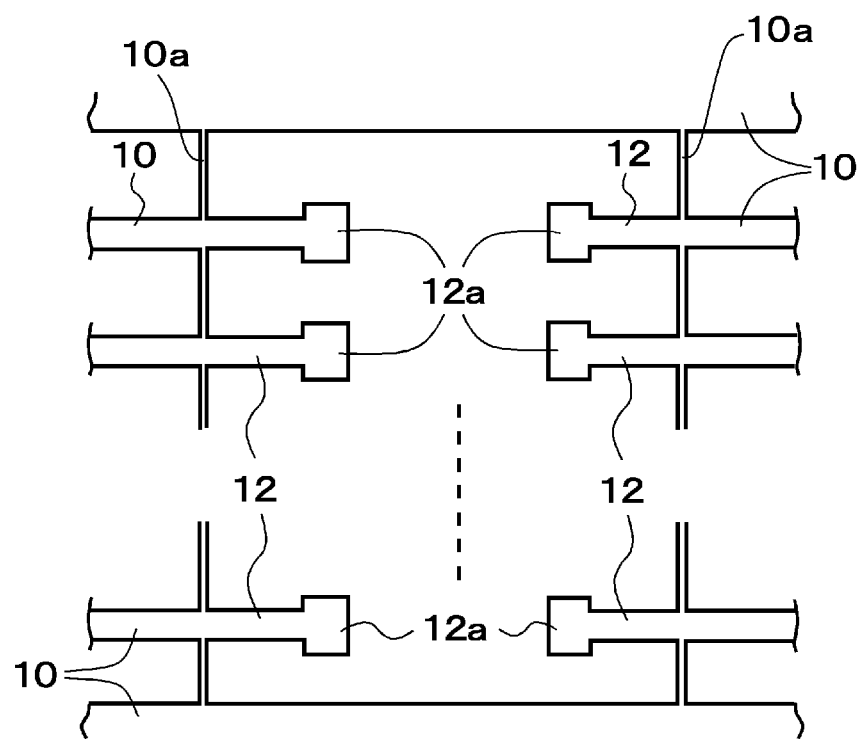
FIG. 3 is a plan view illustrating a sample of configuration of an aggregated lead frame for producing a plurality of lead built-in type circuit packages.

In the case of producing such a lead built-in type circuit package, the circuit package is produced in such a manner that by using the lead frame 10 consisting of a plurality of leads tied in with each other for circuit package as shown in FIG. 3, the circuit elements 13 are mounted on a plural sets of inner lead terminals, respectively by connecting the circuit elements 13 to each of the pair of inner leads 12a as shown in FIG. 1C, and then these circuit elements 13, the inner lead 12a and the outer lead 12 are collectively subjected to resin molding and then separation into respective packages for singulation.

Figure 4:
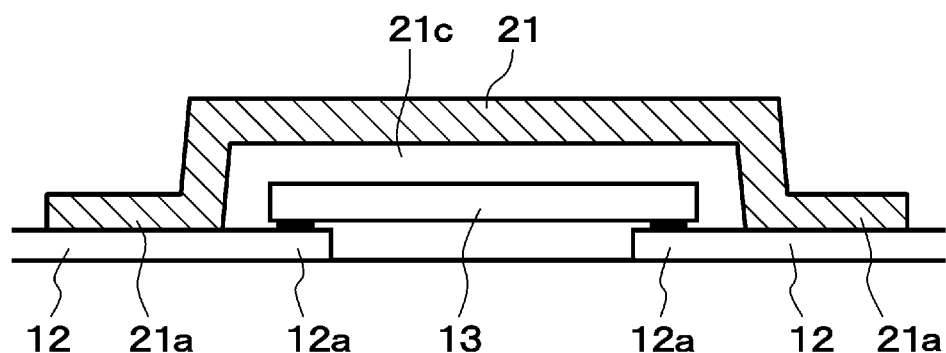
FIG. 4 is a cross-sectional view illustrating a mold being placed on a lead frame at forming resin molding in one example of the present invention.
Figure 5:
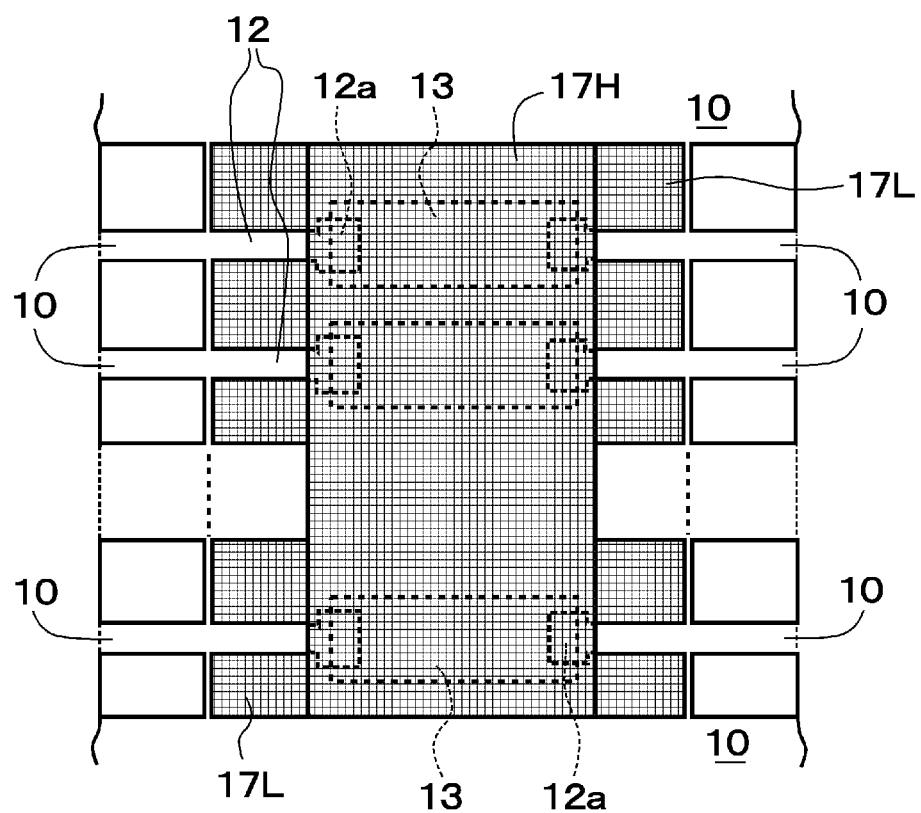
FIG. 5 is a plan view illustrating a resin molding formed using the lead frame shown in FIG. 3.

In such an aggregate as mentioned above in which a plurality of circuit elements 13 are connected to the inner lead frames 12a, as shown in FIG. 4 illustrating a metal mold 21 placed so as to cover the inner lead frame 12a and the circuit element 13, the (upper) metal mold 21 is set so that the circuit element 13 is within a cavity 21c of the metal mold 21. As it can be seen from FIG. 4, this metal mold 21 is formed so that when the metal mold 21 is set to the lead frame 10, the flange portion 21a around the cavity 21c is in close contact with the top surface of the lead frame 10 and the flange portion 21a covers the outer lead 12. Namely, unlike usual molding, the lead frame 10 is formed so that the distance from the end of the cavity 21c to the tie bar 10a of the lead frame 10 is a distance exceeding the length of the outer lead 12 and that the flange portion 21a of the metal mold 21 extends up to the tie bar 10a. Therefore, not only a resin is filled in the cavity 21c but also even a portion under the flange 21a outside the cavity 21c, the resin is filled in a gap between the leads. As a result, as shown in FIG. 5, the first molded resin portion 17H is formed in the cavity 21c, and the second molded resin portion 17L is formed between the outer leads 12 outside the cavity 21c.

As a result, since the upper surface of the outer lead 12 is covered with the metal mold 21 (and a lower surface is covered with another mold omitted in FIG. 4), the resin is attached to neither of the upper and lower surfaces, the side portions of the outer leads 12 except the upper and lower surface are covered with the second molded resin portion 17L, and periphery of the circuit element 13, and connecting portions between the circuit element 13 and the wire 15 and between the circuit element 13 and the die attach material 14 are covered with the first molded resin portion 17H. Namely, the resin molding is carried out at the upper side from the bottom of the lead frame 10 in the aggregate. In this resin molding, the second molded resin portion 17L having the same thickness as the outer lead 12 is formed on the side portions of the outer leads 12, and the first molded resin portion 17H having a thickness so as to surround the circuit element 13 and the wire 15 is formed around the circuit element 13.

Figure 6:
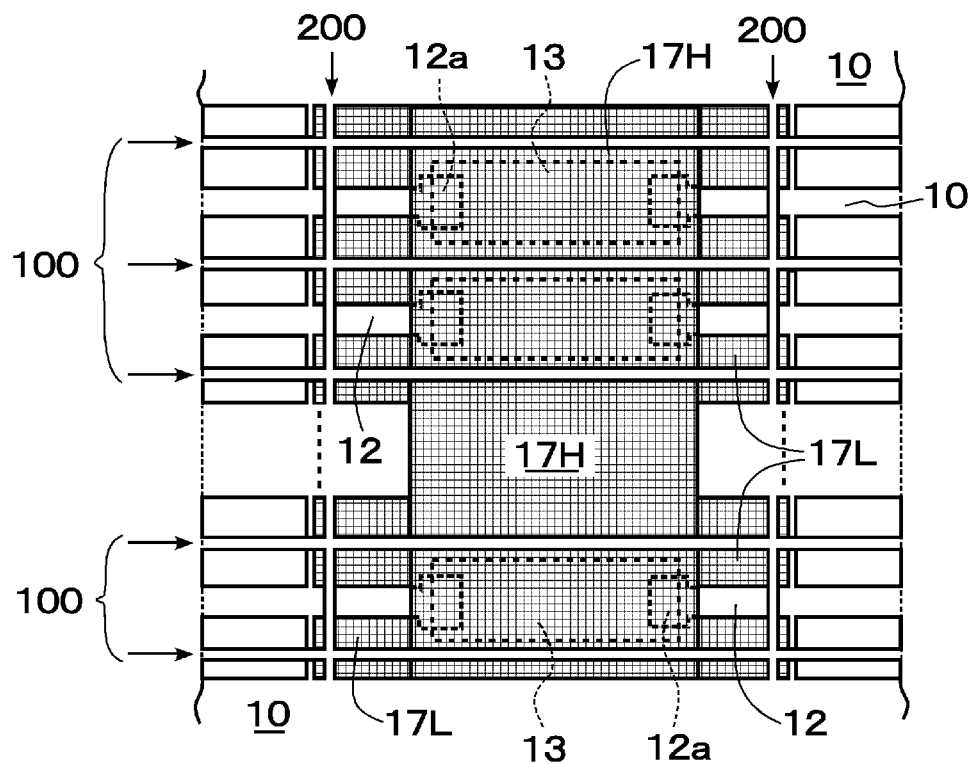
FIG. 6 is an explanatory view on dicing for singulation for separating into respective packages after resin molding using an aggregated lead frame.

Thereafter, as shown in FIG. 6, the aggregate is cut at the positions of horizontal cutting lines 100 and vertical cutting lines 200 by dicing with a blade, a laser or the like to be separated into the respective packages for singulation. After the singulation, the obtained circuit packages are in a state as shown in FIG. 1A to FIG. 1C. As shown, in these circuit packages, the second molded resin portion 17L is attached to the both sides of the outer lead 12, and the periphery of the circuit element 13 including the die attach material 14 and the wire 15 is sealed with the first molded resin portion 17H.

Further, in this embodiment, by carrying out the dicing at the vertical cutting lines 200, the lead frame 10 is cut at a given position, and by changing the position of this vertical cutting lines 200, a length of the outer lead 12 can be optionally selected, thereby making it possible to obtain the outer lead 12 having a proper length fitted to a specification of an electric circuit to which the circuit package is mounted. In addition, it is necessary to set the vertical cutting lines 200 to be located at an inner side from the tie bar 10a toward the inner lead 12a side.

While in the embodiment shown in FIG. 1A to FIG. 1C, the circuit element 13 is directly connected to the end portions of the inner lead 12a, it is proposed that separately from the inner leads 12a, an island for mounting the circuit element 13 may be provided as a part of the lead frame 10 between the pair of inner leads 12a and the circuit element 13 may be provided on the island and connected to the inner leads 12a by wire bonding.

Figure 2:
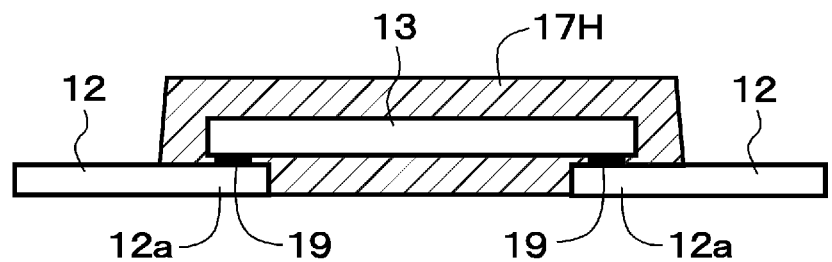
FIG. 2 is a side cross-sectional view illustrating other configuration of a lead built-in type circuit package of one example of the present invention.

FIG. 2 illustrates an example of other configuration of the lead built-in type circuit package. In this circuit package, the surface electrode terminal portions of the circuit element 13 are connected to the end portions of the inner lead 12a with a metallic bump 19 by means of face down method. Other configurations are the same as in FIG. 1A to FIG. 1C. Such a circuit package is also configured by the above-mentioned production method such that the second molded resin portion 17L is attached to the both sides of the outer lead 12, and the periphery of the circuit element 13 including the connecting portions of the metallic bump 19 are sealed with the first molded resin portion 17H.

As mentioned above, in this embodiment, since the sealing with a resin is carried out by one side resin molding using an upper side mold, a lower side mold like conventional molding is not necessary and a cutting die is also not required. Moreover, regarding a width, a length, and the like of the mold area and the lead frame, it is possible to fit them to various specifications by designing them (design of lead frame, etc.) with optional dimensions, and unification of the dimensions makes it possible to reduce equipment investment necessary for mounting circuit elements such as semiconductor elements.

Furthermore, since the lead frame 10 with the molded resin portions is separated by the dicing method using a blade, a laser or the like, its lead length, etc. can be changed only by changing the machining condition, thereby reducing equipment investment for cutting, and yet, since a lead length can be easily changed to a minimum length needed for welding, there is no excess portion of the lead arising at welding and a minimum size of a package can be produced.

Further, when mounting the circuit package of this embodiment, it is possible to carry out welding, joining, and bonding by soldering or the like on either of the top surface and bottom surface (right surface and back surface) of the outer lead 12, and in this case, welding of the outer lead 12 is easy since the both sides of the outer lead 12 are fixed with the molding resin.

Figure 7:
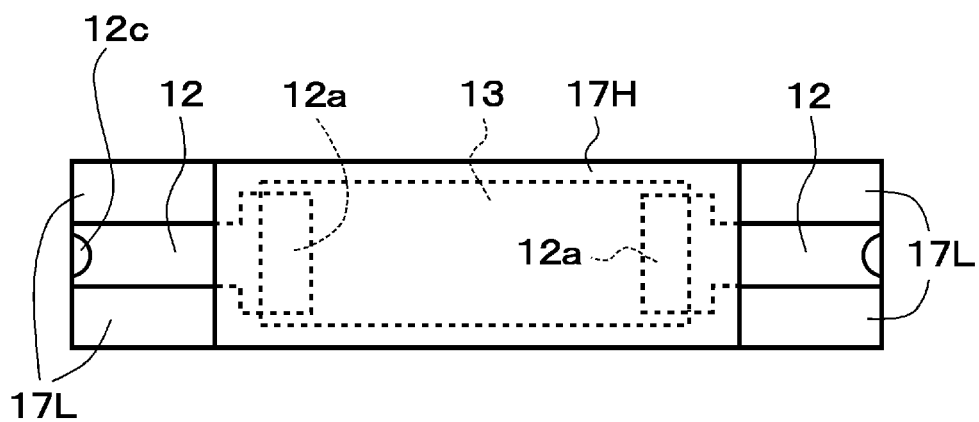
FIG. 7 is a plan view illustrating a lead built-in type circuit package of other embodiment of the present invention.
Figure 8:
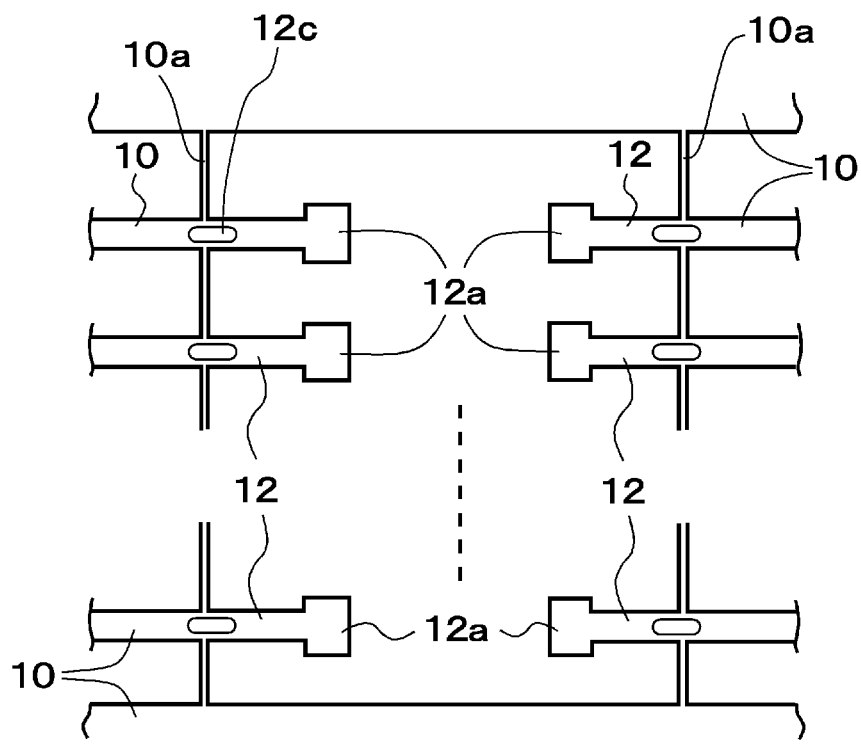
FIG. 8 is a plan view illustrating one example of an aggregated lead frame of other embodiment of the present invention.
Figure 9:
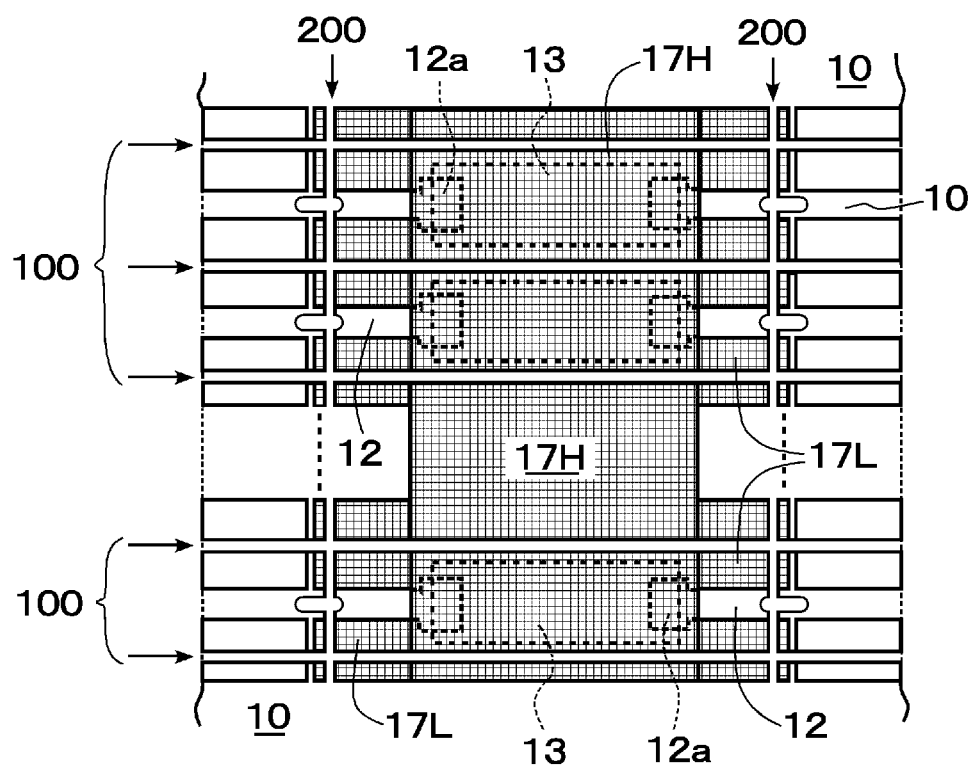
FIG. 9 is an explanatory view on resin molding using the lead frame shown in FIG. 8 to separate into respective packages for singulation.

FIG. 7 to FIG. 9 are similar to FIG. 1A, FIG. 3 and FIG. 6 illustrating other embodiment of the present invention. Namely, in this embodiment, an elliptic through-hole 12c is formed at the cutting portion of the outer lead 12 of the lead frame 10, namely at an inner side from the tie bar 10a toward the inner lead 12a side. This is different from the examples shown in FIG. 1A, FIG. 3 and FIG. 6. Other points are the same as these examples, and therefore, explanation thereon are omitted.

Namely, in this embodiment, as it is clear from FIG. 8, the elliptic through-hole 12c is formed at an inner side from the tie bar 10a toward the inner lead 12a side. This elliptic through-hole 12c is blocked with the flange portion 21a of the metal mold 21 at the time of resin molding as mentioned above, and no resin enters therein. Therefore, after the resin molding, by outer plating of the lead frame 10, for example, with a Sn-based material, the inner wall surface of the through-hole 12c is also plated. As a result, as shown in FIG. 9, by cutting at the vertical cutting lines 200, a part of the inner wall surface of the through-hole 12c plated with the Sn-based material or the like is exposed at the end portion of the outer lead 12 as shown in FIG. 7.

In the example shown in FIG. 1A, since the second molded resin portion is formed at both sides of the outer lead 12, an accident where the outer leads 12 contact each other can be prevented but a contact area for soldering is too small. However, in this embodiment, since a portion plated with a material having good solder wettability, for example, Sn is formed on the end portion of the outer lead 12, a solder creeps up and covers this plated portion to form a fillet, which assures that highly reliable soldering can be performed.

In each of the above-mentioned embodiments, the resin molding is provided on the upper side surface (top surface), but by reversing the top side and the bottom side of FIG. 1A to FIG. 1C, the resin molding may be provided on the lower side surface.

What is claimed is:

1. A lead built-in type circuit package compromising:
   an inner lead and an outer lead, the inner lead and the outer lead having a first surface and a second surface opposite the first surface;
   a circuit element connected to the first surface of the inner lead;
   a first molded resin portion formed from the second surface of the inner lead extending toward the first surface of the inner lead embedding the inner lead and the circuit element; and
   a second molded resin portion formed on side portions of the outer lead excluding the first and second surfaces of the outer lead.

2. A method for producing lead built-in type circuit packages comprising:
   providing an aggregate lead frame having a first surface and a second surface opposite to the first surface for forming a plurality of lead built-in type circuit packages, the aggregate lead frame having inner leads, outer leads and tie bars located at a given position on each of the outer leads;
   connecting a plurality of circuit elements for the plurality of circuit packages, respectively to the inner leads at the first surface of the aggregate lead frame;
   providing a mold having a cavity and a flange portion, the cavity covers the circuit elements and the inner leads and the flange portion faces toward the outer lead on the first surface of the aggregate lead frame;
   injecting a molding resin to form a first molded resin portion and second molded resin portions, the first molded resin portion embedding the circuit elements, and the second molded resin portions being formed on side portions of each of the outer leads; and
   separating the aggregate lead frame formed with the circuit elements, the first molded resin portion and the second molded resin portions into respective packages by dicing.

\* \* \* \* \*